United States Patent
Fung

(10) Patent No.: US 12,035,518 B2
(45) Date of Patent: Jul. 9, 2024

(54) NON-INTERLEAVING N-WELL AND P-WELL PICKUP REGION DESIGN FOR IC DEVICES

(71) Applicant: Taiwan Semiconductor Manufacturing Co., Ltd., Hsin-Chu (TW)

(72) Inventor: Ka-Hing Fung, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/871,603

(22) Filed: Jul. 22, 2022

(65) Prior Publication Data

US 2022/0375943 A1 Nov. 24, 2022

Related U.S. Application Data

(62) Division of application No. 17/011,440, filed on Sep. 3, 2020, now Pat. No. 11,469,238.

(60) Provisional application No. 62/906,459, filed on Sep. 26, 2019.

(51) Int. Cl.
| | |
|---|---|
| H01L 27/11 | (2006.01) |
| G06F 30/392 | (2020.01) |
| G11C 11/412 | (2006.01) |
| H01L 27/092 | (2006.01) |
| H01L 29/78 | (2006.01) |
| H10B 10/00 | (2023.01) |

(52) U.S. Cl.
CPC .......... *H10B 10/12* (2023.02); *G06F 30/392* (2020.01); *G11C 11/412* (2013.01); *H01L 27/0924* (2013.01); *H01L 29/785* (2013.01); *H01L 2029/7858* (2013.01)

(58) Field of Classification Search
CPC ............ H01L 27/0207; H01L 27/1104; H01L 27/0924; H01L 29/785; H01L 2029/7858; G11C 11/412; G06F 30/392; H10B 10/12
See application file for complete search history.

(56) References Cited

U.S. PATENT DOCUMENTS

| | | | |
|---|---|---|---|
| 7,425,740 | B2 | 9/2008 | Liu et al. |
| 8,048,723 | B2 | 11/2011 | Chang et al. |
| 8,053,299 | B2 | 11/2011 | Xu et al. |

(Continued)

FOREIGN PATENT DOCUMENTS

| | | |
|---|---|---|
| CN | 102315219 A | 1/2012 |
| CN | 103579342 A | 2/2014 |

(Continued)

*Primary Examiner* — Nelson Garces
(74) *Attorney, Agent, or Firm* — Haynes and Boone, LLP

(57) ABSTRACT

A semiconductor device includes a first region, a second region, a third region, and a fourth region. The first region includes a first portion of an N-well and a plurality of P-type transistors formed over the first portion of the N-well. The first region extends in a first direction. The second region includes a first portion of a P-well and a plurality of N-type transistors formed over the first portion of the P-well. The second region extends in the first direction. The third region includes a second portion of the P-well. The fourth region includes a second portion of the N-well. The first region and the second region are disposed between the third region and the fourth region.

20 Claims, 10 Drawing Sheets

(56) References Cited

U.S. PATENT DOCUMENTS

| | | |
|---|---|---|
| 8,183,627 B2 | 5/2012 | Currie et al. |
| 8,415,718 B2 | 4/2013 | Xu |
| 8,497,177 B1 | 7/2013 | Chang et al. |
| 8,609,518 B2 | 12/2013 | Wann et al. |
| 8,618,556 B2 | 12/2013 | Wu et al. |
| 8,633,516 B1 | 1/2014 | Wu et al. |
| 8,703,565 B2 | 4/2014 | Chang et al. |
| 8,742,509 B2 | 6/2014 | Lee et al. |
| 8,776,734 B1 | 7/2014 | Roy et al. |
| 8,785,285 B2 | 7/2014 | Tsai et al. |
| 8,796,666 B1 | 8/2014 | Huang et al. |
| 8,815,712 B2 | 8/2014 | Wan et al. |
| 2006/0197110 A1 | 9/2006 | Sugahara |
| 2013/0187235 A1 | 7/2013 | Huang |
| 2013/0285153 A1 | 10/2013 | Lee et al. |
| 2014/0177312 A1 | 6/2014 | Shibata et al. |
| 2014/0183600 A1 | 7/2014 | Chen et al. |
| 2014/0264590 A1 | 9/2014 | Yu et al. |
| 2014/0264592 A1 | 9/2014 | Oxland et al. |
| 2016/0049395 A1* | 2/2016 | Okagaki ............... G06F 30/394 257/401 |
| 2016/0056153 A1 | 2/2016 | Do et al. |
| 2017/0148779 A1 | 5/2017 | Becker |
| 2018/0182766 A1 | 6/2018 | Huang |
| 2019/0097035 A1 | 3/2019 | Lin |

FOREIGN PATENT DOCUMENTS

| | | |
|---|---|---|
| CN | 108257944 A | 7/2018 |
| KR | 20060083966 A | 7/2006 |
| TW | 201539718 A | 10/2015 |

\* cited by examiner

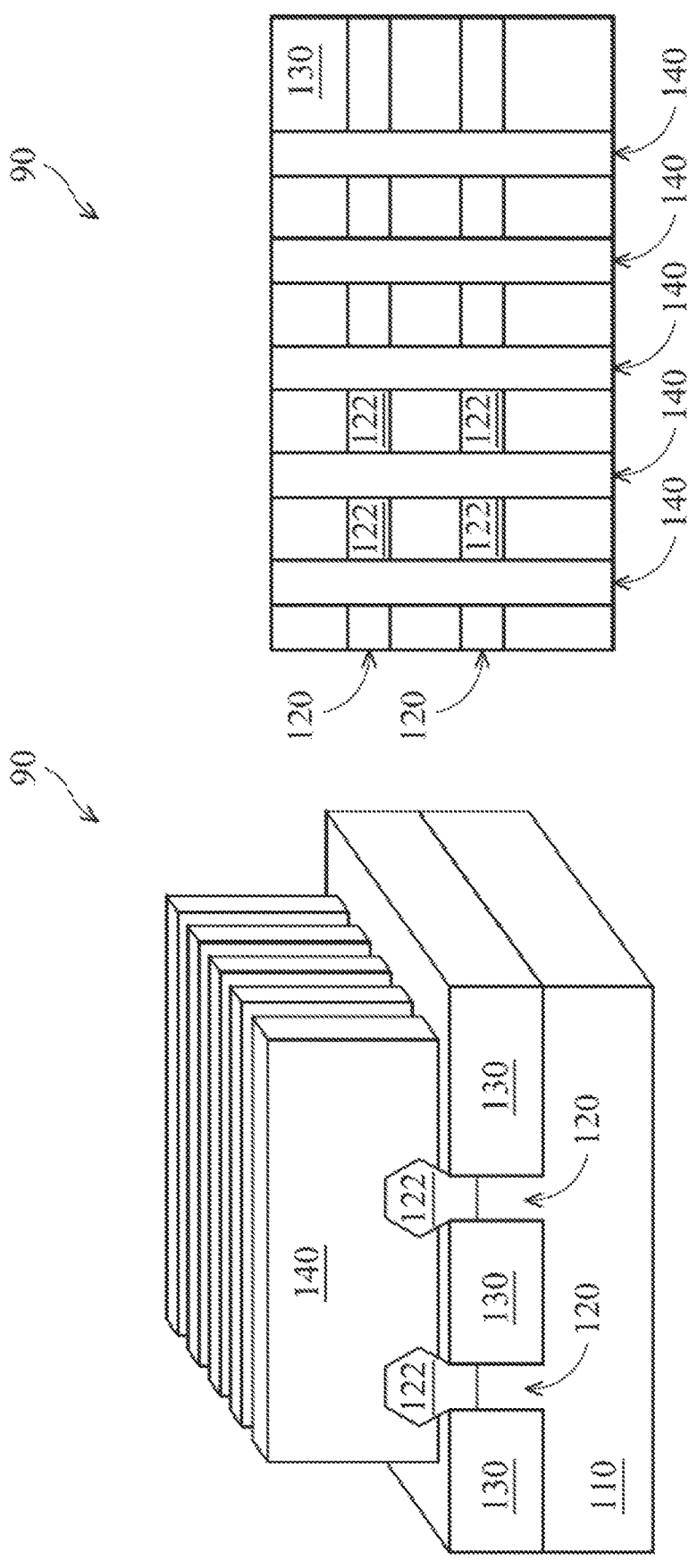

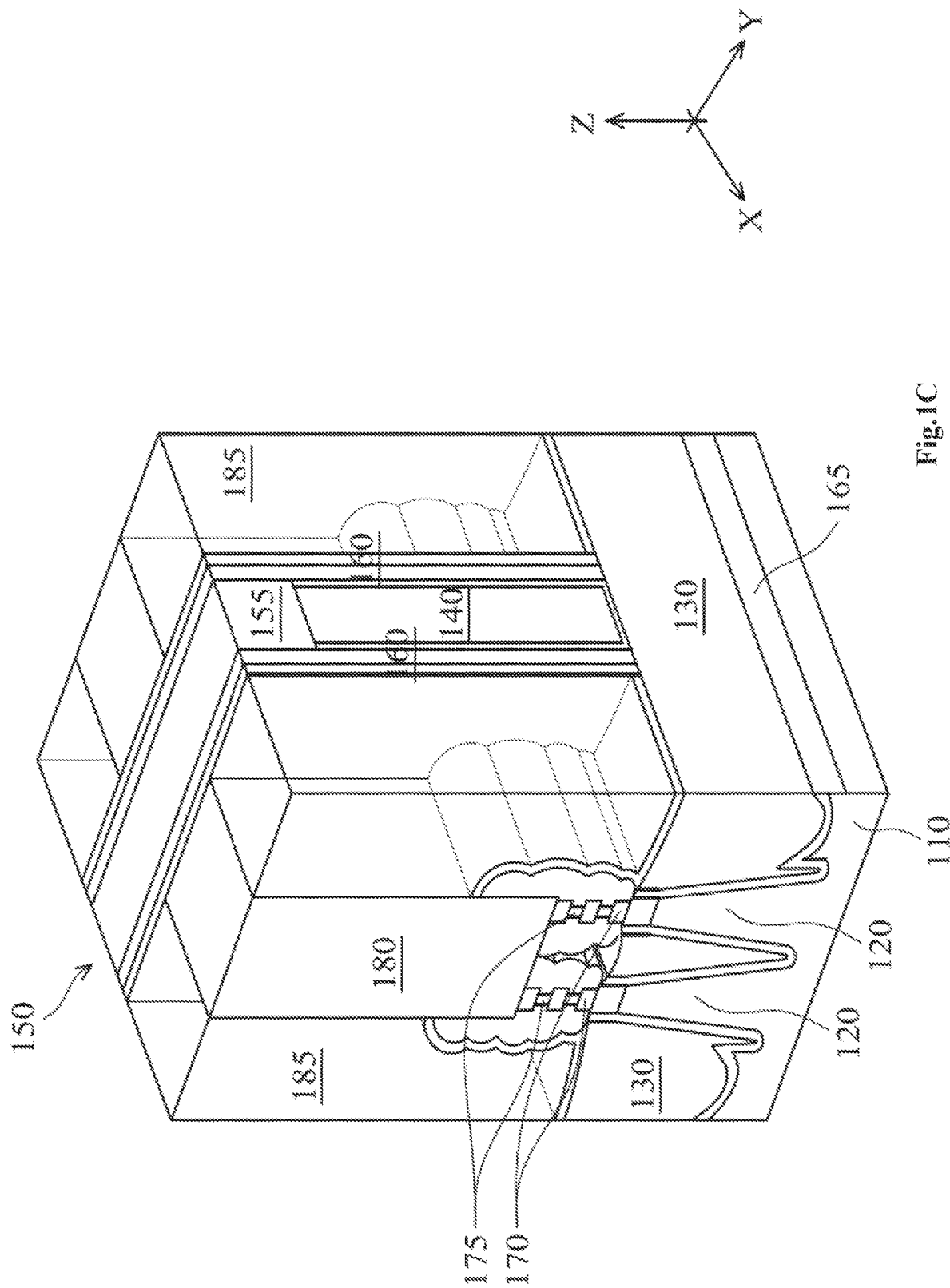

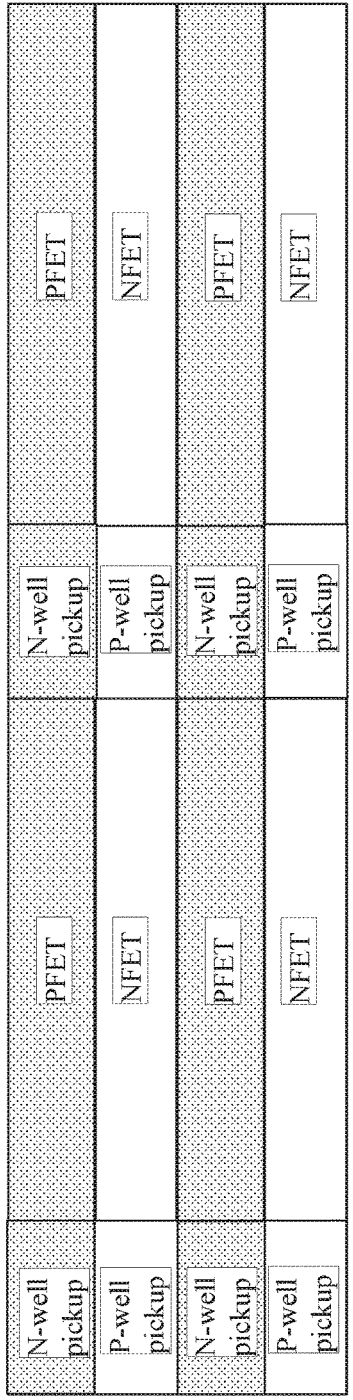
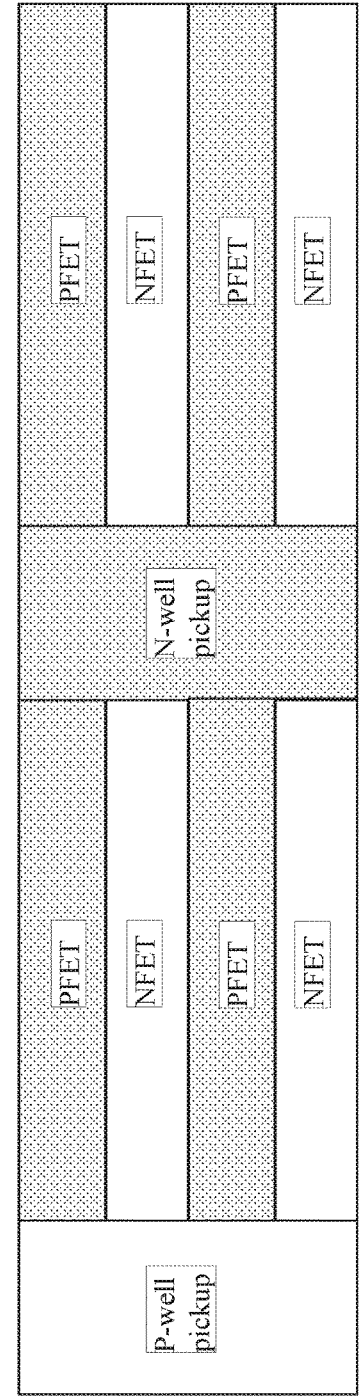
Fig. 6

US 12,035,518 B2

NON-INTERLEAVING N-WELL AND P-WELL PICKUP REGION DESIGN FOR IC DEVICES

PRIORITY DATA

The present application is a divisional Patent Application of utility U.S. patent application Ser. No. 17/011,440, filed on Sep. 3, 2020, entitled "NON-INTERLEAVING N-WELL AND P-WELL PICKUP REGION DESIGN FOR IC DEVICES", which claims priority to U.S. Provisional Patent Application No. 62/906,459, filed on Sep. 26, 2019, and entitled "Well Contact Design to Minimize Latch-Up in Semiconductor Devices and to Increase Logic Density", the disclosures of each of which are hereby incorporated by reference in its entirety.

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

However, such scaling down has also increased the complexity of processing and manufacturing ICs, which may give rise to issues that would not have been problems in older technology nodes. For example, the scaling down process has also scaled down the size of P-well and N-well pickup regions. The smaller sizes of the P-well and N-well pickup regions may lead to implant aperture effects and/or inter-well implant dose compensation, which could then cause problems such as latch-up. As a result, device performance may be degraded and/or device failures may occur.

Therefore, although existing semiconductor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIG. 1A is a perspective view of an IC device in the form of a FinFET according to various aspects of the present disclosure.

FIG. 1B is a planar top view of an IC device in the form of a FinFET according to various aspects of the present disclosure.

FIG. 1C is a perspective view of an IC device in the form of a GAA device according to various aspects of the present disclosure.

FIG. 6 are top views of portions of IC layout designs according to various aspects of the present disclosure.

DETAILED DESCRIPTION

Figure 2:
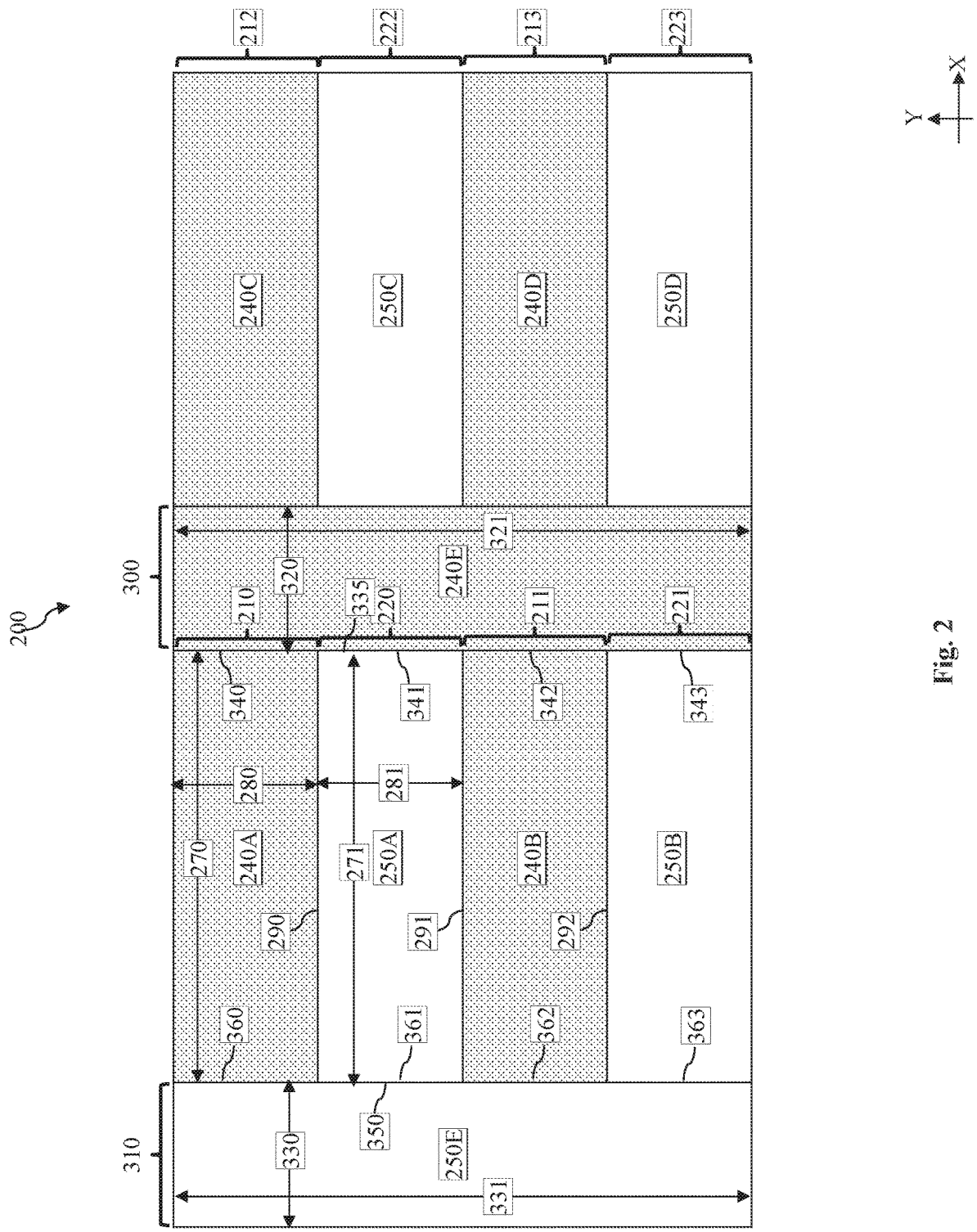
FIGS. 2-3 are planar top views of portions of an IC device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, and more particularly to field-effect transistors (FETs), such as three-dimensional fin-line FETs (FinFETs) or multi-channel gate-all-around (GAA) devices, or even planar FETs. One aspect of the present disclosure involves reconfiguring the N-well and P-well pickup regions, such that a first plurality of small and interleaving N-well and P-well pickup regions are reconfigured into a much bigger continuous N-well pickup region, and a second plurality of small and interleaving N-well and P-well pickup regions are reconfigured into a much bigger continuous P-well pickup region. As a result, device yield, reliability, and/or performance may be improved, as discussed below in more detail.

FIGS. 1A and 1B illustrate a three-dimensional perspective view and a top view, respectively, of a portion of an Integrated Circuit (IC) device 90. The IC device 90 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations, unless otherwise claimed. For example, although the IC device 90 as illustrated is a three-dimensional FinFET device, the concepts of the present disclosure may also apply to GAA devices, or even planar FET devices.

Referring to FIG. 1A, the IC device 90 includes a substrate 110. The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof. Various doped regions, such as source/drain regions, may be formed in or on the substrate 110. The doped regions may be doped with n-type dopants, such as phosphorus or arsenic, and/or p-type dopants, such as boron, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

Three-dimensional active regions 120 are formed on the substrate 110. The active regions 120 are elongated fin-like structures that protrude upwardly out of the substrate 110. As such, the active regions 120 may be interchangeably referred to as fin structures 120 or fin structures 120 hereinafter. The fin structures 120 may be fabricated using suitable processes including photolithography and etch processes. The photolithography process may include forming a photoresist layer overlying the substrate 110, exposing the photoresist to a pattern, performing post-exposure bake processes, and developing the photoresist to form a masking element (not shown) including the resist. The masking element is then used for etching recesses into the substrate 110, leaving the fin structures 120 on the substrate 110. The etching process may include dry etching, wet etching, reactive ion etching (RIE), and/or other suitable processes. In some embodiments, the fin structure 120 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 120.

The IC device 90 also includes source/drain features 122 formed over the fin structures 120. The source/drain features 122 may include epi-layers that are epitaxially grown on the fin structures 120. As device sizes continue to shrink, these source/drain features 122 may merge into one another even when they are meant to be kept separate. This is the problem that the present disclosure overcomes, as discussed below in more detail.

The IC device 90 further includes isolation structures 130 formed over the substrate 110. The isolation structures 130 electrically separate various components of the IC device 90. The isolation structures 130 may include silicon oxide, silicon nitride, silicon oxynitride, fluoride-doped silicate glass (FSG), a low-k dielectric material, and/or other suitable materials. In some embodiments, the isolation structures 130 may include shallow trench isolation (STI) features. In one embodiment, the isolation structures 130 are formed by etching trenches in the substrate 110 during the formation of the fin structures 120. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers.

The IC device 90 also includes gate structures 140 formed over and engaging the fin structures 120 on three sides in a channel region of each fin 120. The gate structures 140 may be dummy gate structures (e.g., containing an oxide gate dielectric and a polysilicon gate electrode), or they may be HKMG structures that contain a high-k gate dielectric and a metal gate electrode, where the HKMG structures are formed by replacing the dummy gate structures. Though not depicted herein, the gate structure 140 may include additional material layers, such as an interfacial layer over the fin structures 120, a capping layer, other suitable layers, or combinations thereof.

Referring to FIG. 1B, multiple fin structures 120 are oriented lengthwise along the X-direction, and multiple gate structure 140 are oriented lengthwise along the Y-direction, i.e., generally perpendicular to the fin structures 120. In many embodiments, the IC device 90 includes additional features such as gate spacers disposed along sidewalls of the gate structures 140, hard mask layer(s) disposed over the gate structures 140, and numerous other features.

As discussed above, the various aspects of the present disclosure discussed below may apply to multi-channel devices such as Gate-All-Around (GAA) devices. FIG. 1C illustrates a three-dimensional perspective view of an example GAA device 150. For reasons of consistency and clarity, similar components in FIG. 1C and FIGS. 1A-1B will be labeled the same. For example, active regions such as fin structures 120 rise vertically upwards out of the substrate 110 in the Z-direction. The isolation structures 130 provide electrical separation between the fin structures 120. The gate structure 140 is located over the fin structures 120 and over the isolation structures 130. A mask 155 is located over the gate structure 140, and gate spacers 160 are located on sidewalls of the gate structure 140. A capping layer 165 is formed over the fin structures 120 to protect the fin structures 120 from oxidation during the forming of the isolation structures 130.

A plurality of nano-structures 170 are disposed over each of the fin structures 120. The nano-structures 170 may include nano-sheets, nano-tubes, or nano-wires, or some other type of nano-structure that extends horizontally in the X-direction. Portions of the nano-structures 170 under the gate structure 140 may serve as the channels of the GAA device 150. Dielectric inner spacers 175 may be disposed between the nano-structures 170. In addition, although not illustrated for reasons of simplicity, each of the nano-structures 170 may be wrapped around circumferentially by a gate dielectric as well as a gate electrode. In the illustrated embodiment, the portions of the nano-structures 170 outside the gate structure 140 may serve as the source/drain features of the GAA device 150. However, in some embodiments, continuous source/drain features may be epitaxially grown over portions of the fin structures 120 outside of the gate structure 140. Regardless, conductive source/drain contacts 180 may be formed over the source/drain features to provide electrical connectivity thereto. An interlayer dielectric (ILD) 185 is formed over the isolation structures 130 and around the gate structure 140 and the source/drain contacts 180.

Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No. 10,361,278, titled "Method of Manufacturing a Semiconductor Device and a Semiconductor Device" and issued on Jul. 23, 2019, and also in U.S. Pat. No. 9,887,269, titled "Multi-Gate Device and Method of Fabrication Thereof" and issued on Feb. 6, 2018, the disclosures of each which are hereby incorporated by reference in their respective entireties. To the extent that the present disclosure refers to a fin structure or FinFET devices, such discussions may apply equally to the GAA devices.

FIG. 2 is a simplified diagrammatic fragmentary top view of an IC device 200 according to various aspects of the present disclosure. For reasons of simplicity and clarity, the top view of FIG. 2 illustrates the various N-wells and P-wells of the IC device 200, but not the other microelectronic components of the IC device 200, such as fin structures (or active regions), gate structures, contacts, vias, or metal lines.

The IC device 200 includes a plurality of PFET regions and a plurality of NFET regions, for example PFET regions 210, 211, 212, and 213, and NFET regions 220, 221, 222, and 223. The PFET regions 210-213 each include an N-well. For example, the PFET region 210 includes an N-well 240A, the PFET region 211 includes an N-well 240B, the PFET region 212 includes an N-well 240C, and the PFET region 213 includes an N-well 240D. The NFET regions 220-223 each include a P-well. For example, the NFET region 220 includes a P-well 250A, the NFET region 221 includes a P-well 250B, the NFET region 222 includes a P-well 250C, and the NFET region 223 includes a P-well 250D. In some embodiments, the N-wells 240A-240D and the P-wells 250A-250D may correspond to doped portions of the substrate 110 shown in FIG. 1A. Although not illustrated for reasons of simplicity, it is understood that P-type source/drain components may be formed over the N-wells 240A-240D in the PFET regions 210-213, and that N-type source/drain components may be formed over the P-wells 250A-250D in the NFET regions 220-223.

The N-wells 240A-240D (and thus the PFET regions 210-213) each have a dimension 270 measured in the X-direction, and the P-wells 250A-250D (and thus the NFET regions 220-223) each have a dimension 271 measured in the X-direction. In some embodiments, the dimensions 270 and 271 may each be in a range between about 50 microns and about 500 microns. The N-wells 240A-240D also each have a dimension 280 measured in the Y-direction, and the P-wells 250A-250D each have a dimension 281 measured in the Y-direction. In some embodiments, the dimensions 280 and 281 may each be in a range between about 0.5 microns and about 5 microns. Since the dimensions 270 and 271 are substantially greater than the dimensions 280 and 281 (e.g., by a factor of more than 10, or even a 100), it may be said that the N-wells 240A-240D and the P-wells 250A-250D are each oriented in the X-direction, or each extend in the X-direction.

In some embodiments, the dimension 270 may have a substantially same value as the dimension 271, and the dimension 280 may have a substantially same value as the dimension 281. In other words, the N-wells 240A-240D may be sized the same as the P-wells 250A-250D, or that the PFET regions 210-213 may be sized the same as the NFET regions 220-223. However, it is understood that the N-wells 240A-240D and the P-wells 250A-250D (and thus the PFET regions 210-213 and the NFET regions 220-223) may be sized differently in other embodiments, depending on design needs and/or fabrication requirements.

As shown in FIG. 2, the N-wells 240A-240B interleave with the P-wells 250A-250B in the Y-direction, which is perpendicular to the X-direction. For example, the N-well 240A and the P-well 250A share a border 290, the P-well 250A and the N-well 240B share a border 291, and the N-well 240B and the P-well 250B share a border 292, where the borders 290-292 each extend in the X-direction. Similarly, the N-wells 240C-240D interleave with the P-wells 250C-250D in the Y-direction.

It is understood that the IC device 200 may include a plurality of other N-wells and P-wells that are interleaving in the Y-direction, but these additional N-wells and P-wells are not specifically illustrated herein for space constraints. Since the N-wells 240A-240D correspond to the PFET regions 210-213, respectively, and the P-wells 250A-250D correspond to the NFET regions 220-223, respectively, it may also be said that the PFET regions 210-213 and the NFET regions 220-223 each extend in the X-direction and interleave with one another in the Y-direction.

The PFET regions 210-213 and the NFET regions 220-223 are the regions of the IC device 200 where functional transistors are formed. In some embodiments, these functional transistors include the transistors for various devices such as inverters, flip-flops, multiplexers, etc. As building blocks, the transistors from the PFET regions 210-213 and NFET regions 220-223 may be used to form IC devices such as SRAM devices, ring oscillators, radio frequency (RF) devices, etc.

The IC device 200 also includes a plurality of N-well pickup regions and a plurality of P-well pickup regions. For example, FIG. 2 illustrates an N-well pickup region 300 and a P-well pickup region 310. The N-well pickup region 300 includes an N-well 240E, and the P-well pickup region 310 includes a P-well 250E. In some embodiments, the N-well 240E is connected to the N-wells 240A-240D, and the P-well 250E is connected to the P-wells 250A-250D. In other words, the N-well 240E and the N-wells 240A-240D are different portions of the same N-well, and the P-well 250E and the P-wells 250A-250D are different portions of the same P-well. Although not shown in FIG. 2 for reasons of simplicity, it is understood that dummy transistors may be formed in the N-well pickup region 300 and in the P-well pickup region 310.

The N-well pickup region 300 and the P-well pickup region 310 are regions of the IC device 200 reserved for or configured for applying a predetermined bias voltage. For example, in some embodiments, the N-well pickup region 300 may be electrically tied to a power supply or a voltage rail such as Vdd (or Vcc), whereas the P-well pickup region 310 may be electrically tied to an electrical ground (or Vss). In other words, the N-well 240E may be electrically coupled to the power supply or voltage rail via the dummy transistors in the N-well pickup region 300, and that the P-well 250E may be electrically coupled to the electrical ground via the dummy transistors in the P-well pickup region 310. And since the N-well 240E is a part of the same N-well as the N-wells 240A-240D, and that the P-well 250E is a part of the same P-well as the P-wells 250A-250D, the functional transistors of the PFET regions 210-213 and the NFET regions 220-223 may be properly biased electrically.

Unlike conventional IC devices where the N-well pickup regions and P-well pickup regions are made up of a plurality of small N-wells and P-wells that interleave with one another (e.g., in a similar manner as the N-wells 240A-240B are interleaved with the P-wells 250A-250B), the N-well pickup region 300 herein corresponds to a much bigger and continuous N-well 240E, and the P-well pickup region 310 herein corresponds to a much bigger and continuous P-well 250E.

As shown in FIG. 2, the N-well pickup region 300 and the P-well pickup region 310 each span over multiple PFET regions and NFET regions. For example, the N-well pickup region 300 has a border 335 that extends in the Y-direction, and this border 335 coincides with a border 340 of the PFET region 210, a border 341 of the NFET region 220, a border 342 of the PFET region 211, and a border 343 of the NFET region 221. Similarly, the P-well pickup region 310 has a border 350 that also extends in the Y-direction, and this border 350 coincides with a border 360 of the PFET region 210, a border 361 of the NFET region 220, a border 362 of the PFET region 211, and a border 363 of the NFET region 221. As such, the N-well pickup region 300 and the P-well pickup region 310 are substantially longer (in the Y-direction) than the PFET regions 210-213 and the NFET regions 220-223. This is important, as will be discussed in more detail below.

The N-well 240E (and thus the N-well pickup region 300) has a dimension 320 measured in the X-direction and a dimension 321 measured in the Y-direction, and the P-well 250E (and thus the P-well pickup region 310) has a dimension 330 measured in the X-direction and a dimension 331 measured in the Y-direction. Each of the dimensions 320 and 330 is substantially smaller than each of the dimensions 270 and 271, for example 100 times smaller. In some embodiments, a ratio of the dimension 320 (or dimension 330) and the dimension 270 (or dimension 271) is in a range between about 1:10 and about 1:110000. Meanwhile, each of the dimensions 321 and 331 is substantially greater than each of the dimensions 280 and 281, for example at least four times greater. In some embodiments, a ratio of the dimension 321 (or dimension 331) and the dimension 280 (or dimension 281) is in a range between about 10:1 and about 10000:1. In other words, the well pickup regions 300 and 310 are each substantially narrower (in the X-direction) than each of the PFET 210-213 and NFET regions 220-223, and substantially longer (in the Y-direction) than each of the PFET 210-213 and NFET regions 220-223. These ranges and ratios are not randomly chosen but rather are specifically configured to ensure that the N-well pickup region 300 and the P-well pickup region 310 are large enough such that they are unlikely to suffer from an undesirable implant aperture effect (discussed below in more detail), but not too large to consume an excessive amount of chip area, since chip real estate is valuable and should otherwise be used to implement the functional transistors in the NFET and PFET regions.

It is understood that the dimensions 320 and 321 may be equal to one another in some embodiments, but they may be different in other embodiments. The same is true for the dimensions 330 and 331. Stated differently, the N-well 240E and the P-well 250E (and thus the N-well pickup region 300 and the P-well pickup region 310) may be sized the same in some embodiments, or they may be sized differently in other embodiments. However, regardless of how the N-well 240E and the P-well 250E are sized individually, one unique physical characteristic of the present disclosure is that the N-well 240E and the P-well 250E each span over a plurality of the N-wells of the PFET regions and the P-wells of the NFET regions, rather than interleaving with one another in the Y-direction. Such a configuration improves device performance and/or reliability.

In more detail, conventional IC devices have significantly smaller N-well and P-well pickup regions, which may be aligned with the PFET regions and NFET regions, respectively. As such, conventional IC devices may have a plurality of small N-well and P-well pickup regions that interleave with one another in the Y-direction, in a similar manner as the interleaving PFET and NFET regions. This has not been a significant problem in older technology generations. However, as the device sizes continue to shrink, for example in a 7-nanometer technology node or beyond (i.e., smaller than the 7-nanometer technology node), the ever-smaller sizes of the N-well and P-well pickup regions may present significant challenges.

One problem is excessive inter-well implant dose compensation. This refers to the P-type dopants in the P-well leaking across the N/P boundary into the N-well, and/or the N-type dopants in the N-well leaking across the N/P boundary into the P-well. In older technology generations, the bigger device sizes mean that there were not as many N/P boundaries between the N-well and P-well pickup regions, and therefore there are fewer opportunities for the inter-well implant dose compensation. Even if inter-well implant dose compensation did occur, the leaked dopants will likely only affect a small portion of the other oppositely doped well. However, since the N-well and P-well pickup regions have also been scaled down while still interleaving with one another in certain IC devices fabricated in a 7-nanometer (or smaller) technology node, the number of N/P boundaries has increased, thereby giving rise to many more opportunities for inter-well implant dose compensation to occur. Making matters worse, the smaller footprint of the N-well and P-well pickup regions means that the leaked dopant will have a much greater negative effect on the other well. This problem is exacerbated by the fact that well implants are often deep, for example the wells may have a depth (in the Z-direction of FIG. 1A) in a range between about 100 nanometers and about 1000 nanometers. The great depth of the N-wells and P-wells means that the undesirable inter-well implant dose compensation is even more likely to occur.

Another problem facing the conventional IC devices fabricated in the 7-nanometer node or smaller is the implant aperture effect. In that regard, the N-wells of the N-well pickup region and the P-wells of the P-well pickup region are typically formed by first forming a layer of patterned photoresist layer over a substrate. The patterned photoresist layer includes openings that define the locations of the wells to be formed. Thereafter, ion implantation processes may be performed to implant dopants through the openings and into the substrate while the patterned photoresist layer serves as an implant mask. As the device fabrication progresses to the 7-nanometer technology node or beyond, the ever-smaller openings (and correspondingly greater aspect ratios of the openings) may make it more difficult for the dopants to be implanted to their desired locations in the substrate. For example, the dopants may be bombarded into the sidewall of the opening of the photoresist layer, rather than into the substrate as intended. This will make the dosage of the doped well off-target. In other words, the wells may not be able to achieve an intended dosage or dopant concentration level.

As a result of the inter-well implant dose compensation and/or the implant aperture effect problems occurring in conventional 7-nanometer technology node IC devices, well contact resistance may increase, and/or the wells may be poorly biased. This could cause problems for the IC devices, for example latch-up problems, which could cause the IC devices to leak current and/or burn out prematurely, or otherwise suffer from performance degradations.

In contrast, the present disclosure overcomes the problems of conventional IC devices fabricated using 7-nanometer or smaller technology nodes, because the present disclosure implements relatively "big" N-well 240E and P-well 250E in the well pickup regions, rather than a plurality of small interleaving N-wells and P-wells in the well pickup regions. As a result, the N-well 240E is multiple times bigger (e.g., at least four times bigger) in size than the small N-well implemented in a conventional IC device fabricated using the same technology node (i.e., comparing a 7-nanometer technology node of the present disclosure with a 7-nanometer technology node of a conventional device, so as to make an accurate apples-to-apples comparison). Likewise, the P-well 250E is multiple times bigger (e.g., at least four times bigger) in size than the small P-well implemented in a conventional IC device fabricated using the same technology node.

Due to their much bigger sizes (which translates to much bigger photoresist openings), the N-well 240E and the P-well 250E are much less likely to suffer from the implant aperture effect discussed above. In addition, the elimination of the interleaving configuration of the N-wells and P-wells in the N-well pickup region 300 and the P-well pickup region 310 also translates into an elimination (or at least substantial reduction) of N/P boundaries in the N-well pickup region 300 and the P-well pickup region 310. Accordingly, the inter-well implant dose compensation problem is substantially improved by the present disclosure as well. These improvements may lead to reduction in contact resistance, lower likelihood of latch-up problems, and/or other improvements in device performance and/or reliability.

Due to space constraints, FIG. 2 illustrates only one N-well pickup region 300 and one P-well pickup region 310. However, it is understood that the IC device may include a plurality of additional N-well pickup regions and P-well pickup regions that are similar to (or identical to) the N-well pickup region 300 and the P-well pickup region 310. The same is true for the PFET regions 210-213 and NFET regions 220-223. For example, the configuration of the PFET regions 210-213, NFET regions 220-223, N-well pickup region 300, and P-well pickup region 310 may be repeated a plurality of number of times in the X-direction and/or the Y-direction.

Figure 3:
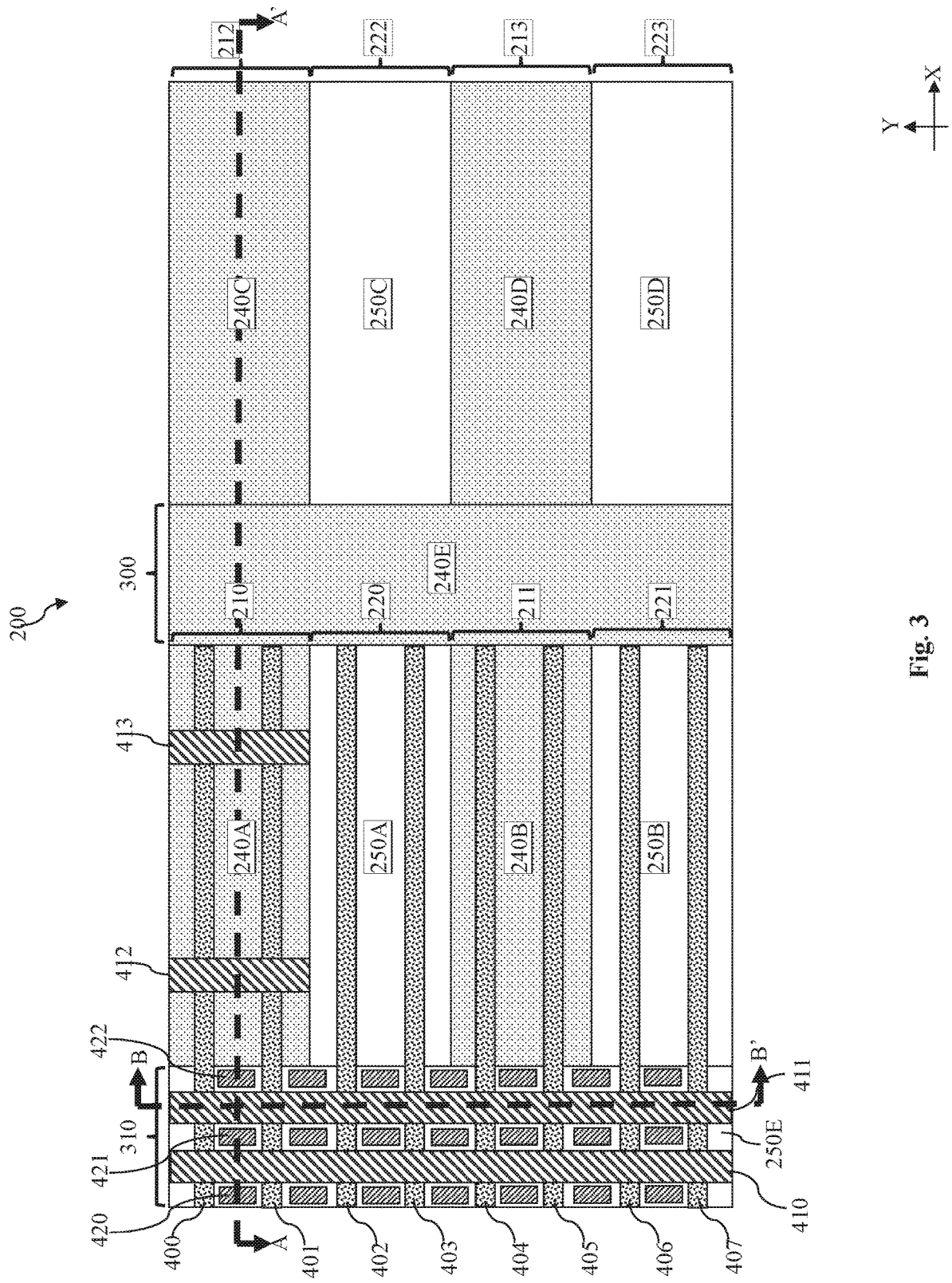

FIG. 3 is another simplified diagrammatic fragmentary top view of the IC device 200 according to various aspects of the present disclosure. Compared to FIG. 2, FIG. 3 illustrates a plurality of other microelectronic components of the IC device 200 to provide greater clarity. For example, FIG. 3 illustrates a plurality of active regions 400-407 that are formed over the N-wells or P-wells (in a Z-direction shown in FIG. 1A) and that each extend in the X-direction. In the case of FinFETs, the active regions 400-407 include fin structures such as the fin structures 120 of FIGS. 1A and 1B. In the case of the multi-channel GAA devices, the active regions 400-407 include the fin structures 120 and the nano-structures such as the nano-structures 170 of FIG. 1C (e.g., nanosheets, nanotubes, nanowires, etc.) that are formed over the fin structures. It is understood that the number and location of the active regions shown in FIG. 3 are merely examples and are not intended to be limiting. Similar active regions may be formed in the PFET regions 212-213 and NFET regions 222-223 and in the N-well pickup region 300, but these active regions are not specifically illustrated herein for reasons of simplicity.

FIG. 3 also illustrates a plurality of gate structures 410-413 that are formed over the active regions 400-407 and that each extend in the Y-direction. For example, the gate structures 410-413 may be implemented as the gate structures 140 of FIGS. 1A-1C. The gate structures 410 and 411 are formed in the P-well pickup region 310 and are dummy gate structures. The gate structures 412 and 413 are formed in the PFET region 210 and are functional gate structures. Stated differently, whereas the transistors (which including active regions and gate structures) in the PFET regions 210-213 and NFET regions 220-223 are functional transistors that are parts of electrical circuits, the transistors in the P-well pickup region 310 and N-well pickup region 300 are dummy transistors that are not parts of electrical circuits, other than providing an electrical path between the P-well 250E (or the N-well 240E) and the power supply or electrical ground. It is understood that the number and location of the gate structures (dummy or not) shown in FIG. 3 are merely examples and are not intended to be limiting. Similar gate structures may be formed in the PFET regions 212-213 and NFET regions 222-223 and in the N-well pickup region 300, but these gate structures are not specifically illustrated herein for reasons of simplicity.

FIG. 3 further illustrates a plurality of conductive contacts that are formed in the P-well pickup region 310. For reasons of simplicity, only three of such conductive contacts 420-422 are labeled in FIG. 3. These conductive contacts such as the conductive contacts 420-422 may be formed over (in the Z-direction shown in FIG. 1A) the dummy source/drains of the dummy transistors located in the P-well pickup region 310. In the top view, the conductive contacts 420-422 are located between the active regions 400-401 and between the dummy gate structures 410-411. The conductive contacts 420-422 provide electrical connections between the P-well 250E and the metal line(s) that are formed above the conductive contacts 420-422 in a multi-layer interconnect structure. Therefore, the conductive contacts 420-422 provide electrical connectivity to the P-well 250E. The conductive contacts 420-422 may also be referred to as P-well pickup contacts. It is understood that a plurality of conductive contacts similar to the conductive contacts 420-422 may be formed in the N-well pickup region 300 to provide electrical connectivity to the N-well 240E, but these conductive contacts in the N-well pickup region 300 are not specifically illustrated herein for reasons of simplicity. Furthermore, similar contacts may be formed in the PFET regions 210-213 and the NFET regions 220-223 to provide electrical connectivity to the functional transistors in these regions, but these contacts are also not specifically illustrated herein for reasons of simplicity.

Figure 4:
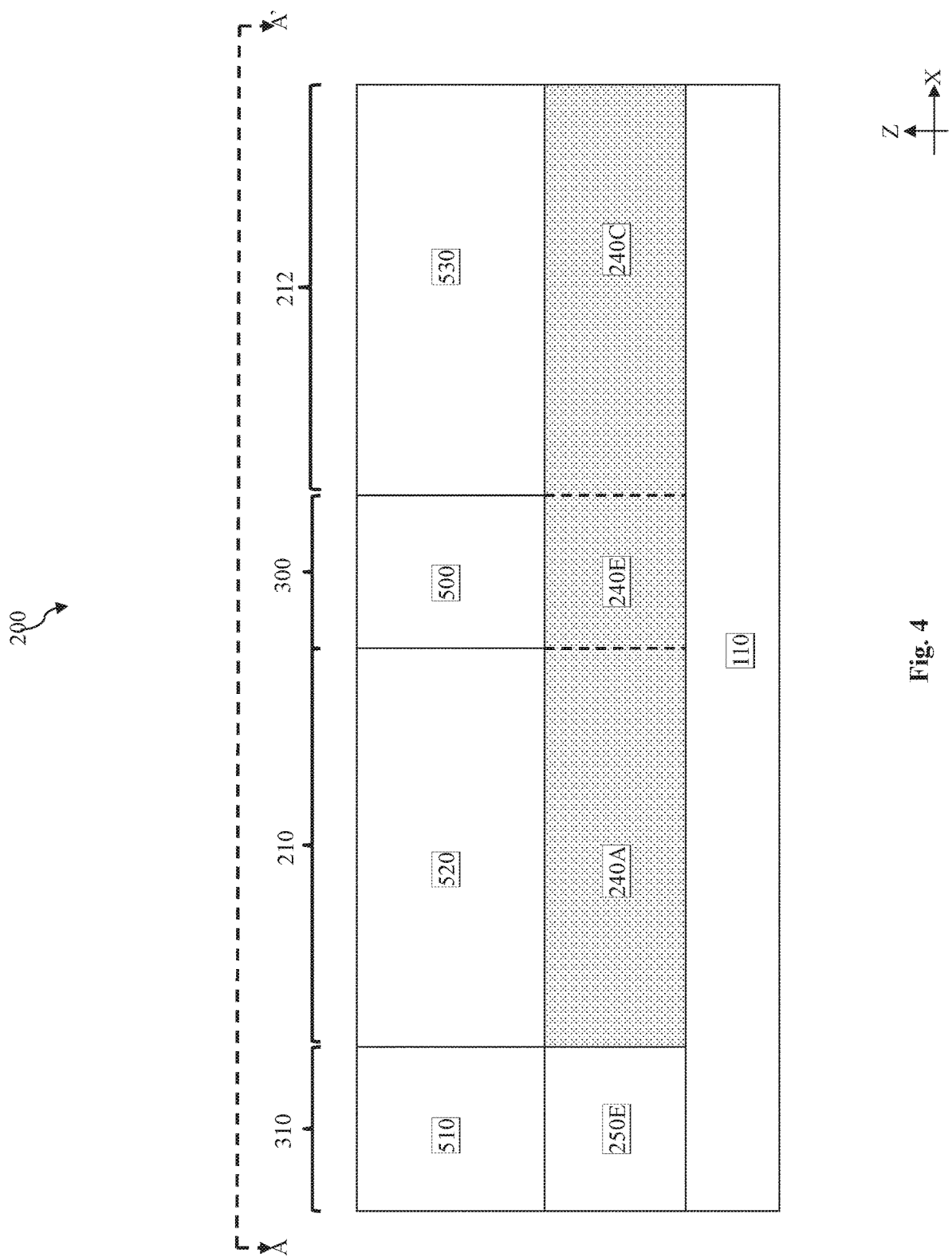
FIGS. 4-5 are cross-sectional side views of portions of an IC device according to various aspects of the present disclosure.

FIG. 4 is a simplified diagrammatic fragmentary cross-sectional side view of the IC device 200 according to embodiments of the present disclosure. The cross-sectional view of FIG. 4 is taken along a cutline A-A' (which extends in the X-direction) shown in FIG. 3. Thus, the cross-sectional view of FIG. 4 may be referred to as an X-Z cross-sectional view. FIG. 4 illustrates the cross-section of the PFET regions 210 and 212, the N-well pickup region 300, and the P-well pickup region 310.

As shown in FIG. 4, the IC device 200 includes the substrate 110, which may be doped with a P-type dopant in some embodiments. The P-well 250E and the N-wells 240A, 240E, and 240C are formed over the substrate 110. As discussed above, the N-wells 240A, 240E, and 240C may be portions of the same N-well, but for reasons of clarity, dashed lines are shown in FIG. 4 to illustrate their virtual "boundaries". These "boundaries" may not be observable in actually fabricated IC devices.

Also as discussed above, one or more dummy transistors 500 are formed over the N-well 240E in the N-well pickup region 300, one or more dummy transistors 510 are formed over the P-well 250E in the P-well pickup region 310. These dummy transistors 500 and 510 may include dummy fin structures, dummy source/drains, dummy gate structures, as discussed above in association with FIG. 3. Note that the conductive contacts 420-422 discussed above in FIG. 3 may also be considered parts of the dummy transistors 500 and 510 in some embodiments. The dummy transistors 500 and 510 may be used to provide electrical connectivity to the N-well pickup region 300 and to the P-well pickup region 310. For example, the dummy transistors 500 may be used to electrically bias the N-well 240E to a power supply or a voltage rail such as Vdd (or Vcc), and the dummy transistors 510 may be used to electrically bias the P-well 250E to electrical ground in some embodiments, or vice versa in other embodiments. For reasons of simplicity, the details of the dummy transistors 500 and 510 are not illustrated herein, though it is understood that these dummy transistors 500 and 510 may be implemented using FinFETs or GAA devices.

A plurality of functional transistors 520 and 530 are also formed in the NFET regions 210 and 212, respectively. The functional transistors 520 and 530 include functional active regions, functional source/drains, and functional gate structures that form transistors that are building blocks of operational circuits. In some embodiments, electrical interconnections such as vias, contacts, or metal lines may also be considered parts of the functional transistors 520 and 530. For reasons of simplicity, the details of the functional transistors 520 and 530 are not illustrated herein, though it is understood that these functional transistors 520 and 530 may be implemented using FinFETs or GAA devices.

Figure 5:
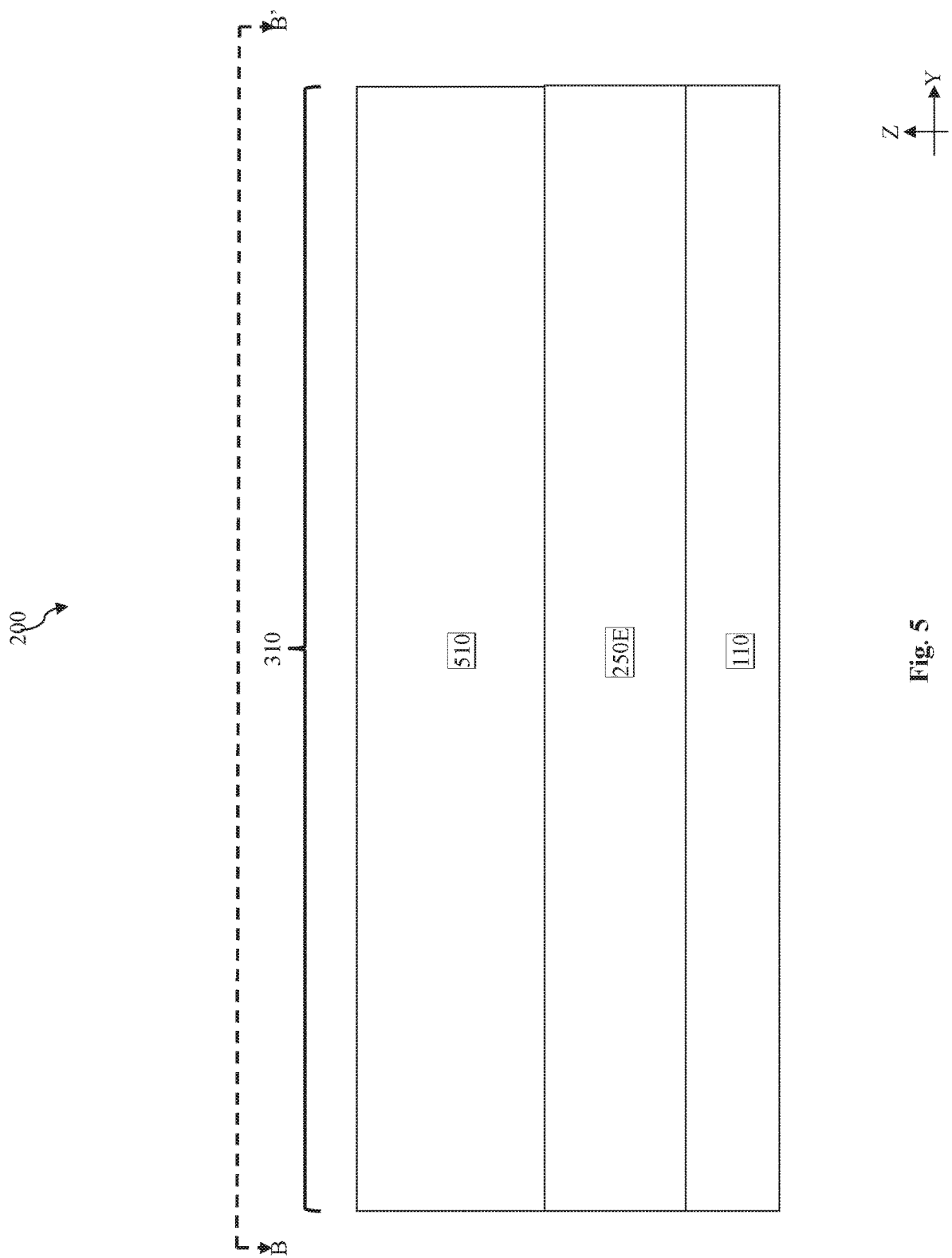

FIG. 5 is another simplified diagrammatic fragmentary cross-sectional side view of the IC device 200 according to embodiments of the present disclosure. The cross-sectional view of FIG. 5 is taken along a cutline B-B' (which extends in the Y-direction) shown in FIG. 3. Thus, the cross-sectional view of FIG. 5 may be referred to as a Y-Z cross-sectional view. FIG. 5 illustrates the cross-section of the P-well pickup region 310, since the PFET regions 210 and 212 and the N-well pickup region 300 are outside of the cutline B-B'.

As shown in FIG. 5, the P-well 250E is formed as a continuous P-well over the substrate 110. As discussed above, this is quite different from conventional devices, where instead of a long continuous P-well (or a continuous N-well if the cross-section had been taken over/on the N-well pickup region 300), the well pickup regions would have had a plurality of small interleaving P-wells and N-wells. The interleaving P-wells and N-wells create many N/P boundaries where dopant diffusion could occur (e.g., inter-well implant dose compensation). In addition, the small sizes of the P-wells and N-wells may be associated with an implant aperture effect. As a result, the configuration of conventional devices may lead to improper biasing of the P-wells and N-wells, which then may cause latch-up, among other problems.

In contrast, the present disclosure prevents the problems associated with conventional IC devices by changing the configuration of the P-well and N-well pickup regions to substantially reduce or eliminate the interleaving small P-wells and N-wells in the well pickup regions. The now significantly larger P-wells (such as P-well 250E) and N-well (such as N-well 240E) in the well pickup regions do not suffer from the problems associated with the many N/P boundaries, thereby reducing or preventing dopant diffusion across such N/P boundaries. The larger sizes of the P-wells and N-wells herein also means that the implant aperture effect is not as pronounced, which means that the P-wells and N-well are also biased more properly. Consequently, problems such as latch-up are significantly reduced.

FIG. 6 illustrates a process 600 in which a received IC layout design is revised according to embodiments of the present disclosure. For example, FIG. 6 illustrates the top view of a portion of a received IC layout design 610. The received IC layout design 610 may be generated by an IC design house, for example. The received IC layout design 610 may include a plurality of NFET regions and PFET regions that each extend in the X-direction and interleave with one another in the Y-direction. Functional transistors are formed in the NFET regions and PFET regions. The received IC layout further includes a plurality of N-well pickup regions and a plurality of P-well pickup regions. The N-well pickup regions and the P-well pickup regions are aligned with the PFET regions and the NFET regions in the X-direction, respectively, and they interleave with one another in the Y-direction in the same manner that the NFET regions and PFET regions interleave with one another. Such a configuration may be undesirable for reasons discussed above, as the interleaving N-well and P-well pickup regions may cause problems such as latch-up.

According to embodiments of the present disclosure, the IC layout revision process 600 is performed to the received IC layout design 610 to generate a revised IC layout design 620. As shown in FIG. 6, the interleaving N-well and P-well pickup regions of the received IC layout design 610 are transformed into a single continuous N-well pickup region and a single continuous P-well pickup region. The N-well pickup region spans over multiple NFET and PFET regions in the Y-direction, and the same is true for the P-well pickup region. As discussed above, such a design helps to reduce inter-well implant dose compensation and alleviates the problems caused by the implant aperture effect. The revised IC layout design 620 may then be used to fabricate IC devices.

Figure 7:
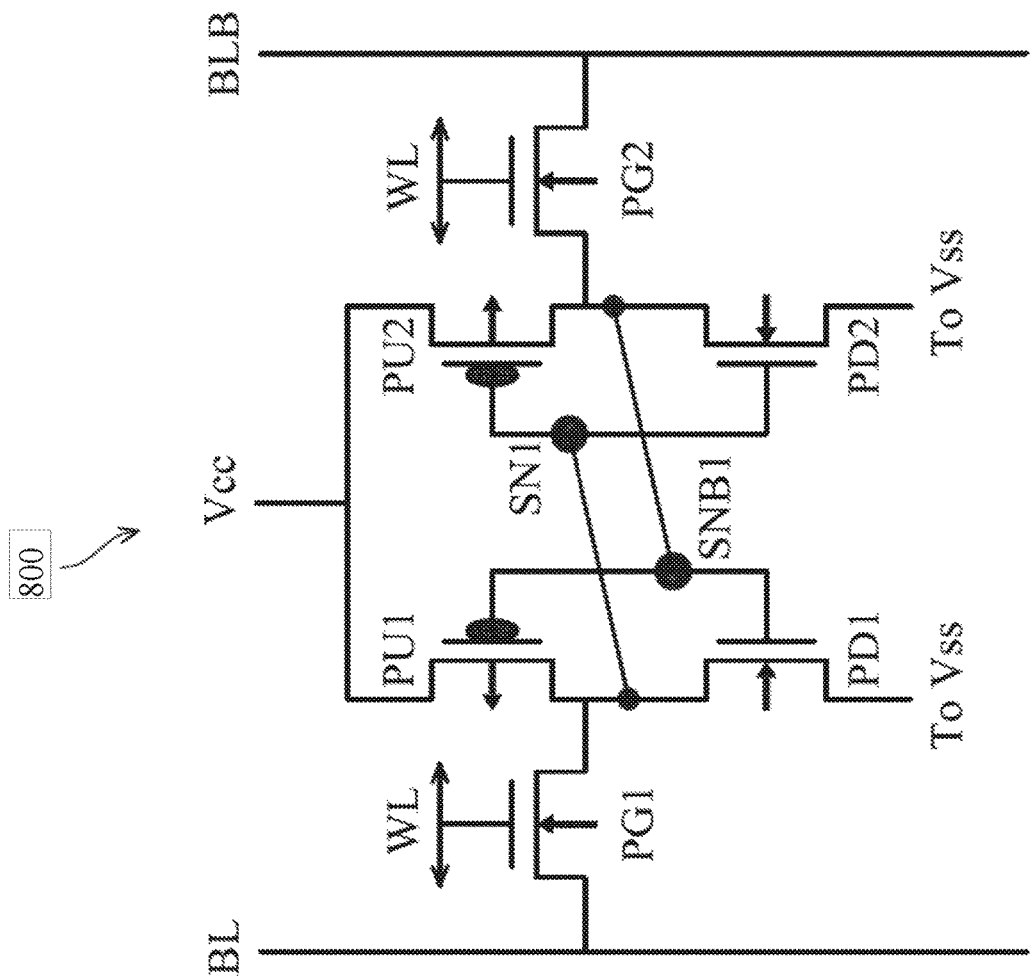
FIG. 7 is a circuit schematic of an SRAM cell according to various aspects of the present disclosure.

The IC device 200 may be implemented in a variety of IC applications, including memory devices such as Static Random-Access Memory (SRAM) devices. In that regard, FIG. 7 illustrates an example circuit schematic for a single-port SRAM cell (e.g., 1-bit SRAM cell) 800. The single-port SRAM cell 800 includes pull-up transistors PU1, PU2; pull-down transistors PD1, PD2; and pass-gate transistors PG1, PG2. As show in the circuit diagram, transistors PU1 and PU2 are p-type transistors, and transistors PG1, PG2, PD1, and PD2 are n-type transistors. According to the various aspects of the present disclosure, the PG1, PG2, PD1, and PD2 transistors are implemented with thinner spacers than the PU1 and PU2 transistors. Since the SRAM cell 800 includes six transistors in the illustrated embodiment, it may also be referred to as a 6T SRAM cell.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vcc (also referred to as Vdd), and the sources of the pull-down transistors PD1 and PD2 are coupled to a voltage Vss, which may be an electrical ground in some embodiments.

The first storage node SN1 of the first data latch is coupled to bit line BL through pass-gate transistor PG1, and the complementary first storage node SNB1 is coupled to complementary bit line BLB through pass-gate transistor PG2. The first storage node N1 and the complementary first storage node SNB1 are complementary nodes that are often at opposite logic levels (logic high or logic low). Gates of pass-gate transistors PG1 and PG2 are coupled to a word line WL. SRAM devices such as the SRAM cell 800 may be implemented using FinFET devices and/or with GAA devices. In some embodiments, the transistors PU1, PU2, PD1, PD2, PG1, and PG2 are implemented using the functional transistors of the IC device 200, for example the transistors 520 and 530 of FIG. 4.

Figure 8:
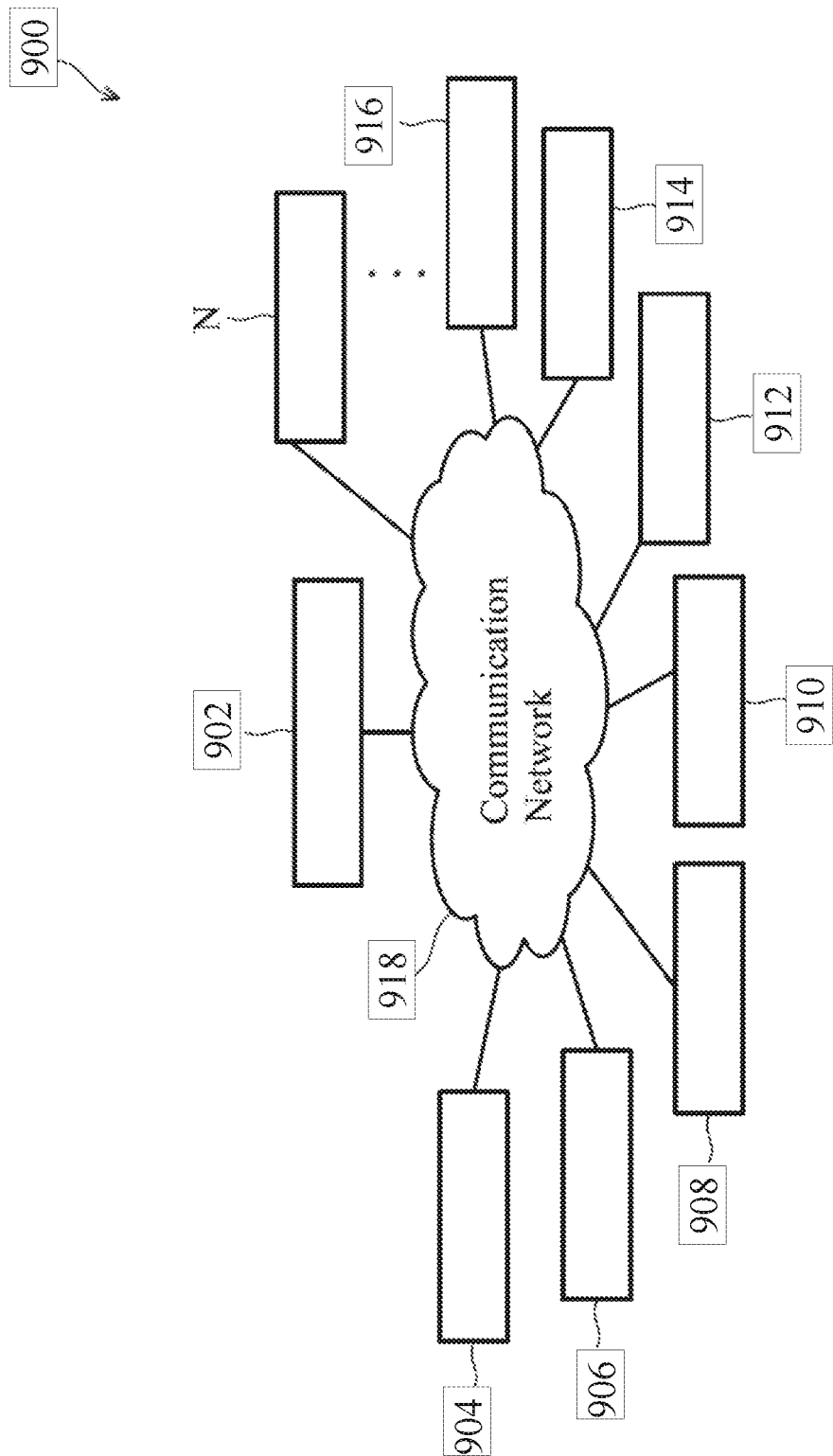
FIG. 8 is a block diagram of a manufacturing system according to various aspects of the present disclosure.

FIG. 8 illustrates an integrated circuit fabrication system 900 according to embodiments of the present disclosure. The fabrication system 900 includes a plurality of entities 902, 904, 906, 908, 910, 912, 914, 916 . . . , N that are connected by a communications network 918. The network 918 may be a single network or may be a variety of different networks, such as an intranet and the Internet, and may include both wire line and wireless communication channels.

In an embodiment, the entity 902 represents a service system for manufacturing collaboration; the entity 904 represents an user, such as product engineer monitoring the interested products; the entity 906 represents an engineer, such as a processing engineer to control process and the relevant recipes, or an equipment engineer to monitor or tune the conditions and setting of the processing tools; the entity 908 represents a metrology tool for IC testing and measurement; the entity 910 represents a semiconductor processing tool, such as an EUV tool that is used to perform lithography processes to define the gate spacers of an SRAM device; the entity 912 represents a virtual metrology module associated with the processing tool 910; the entity 914 represents an advanced processing control module associated with the processing tool 910 and additionally other processing tools; and the entity 916 represents a sampling module associated with the processing tool 910.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 914 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 900 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 900 may enable collaboration and information access in such areas as design, engineering, and processing, metrology, and advanced processing control. Another capability provided by the IC fabrication system 900 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

Figure 9:
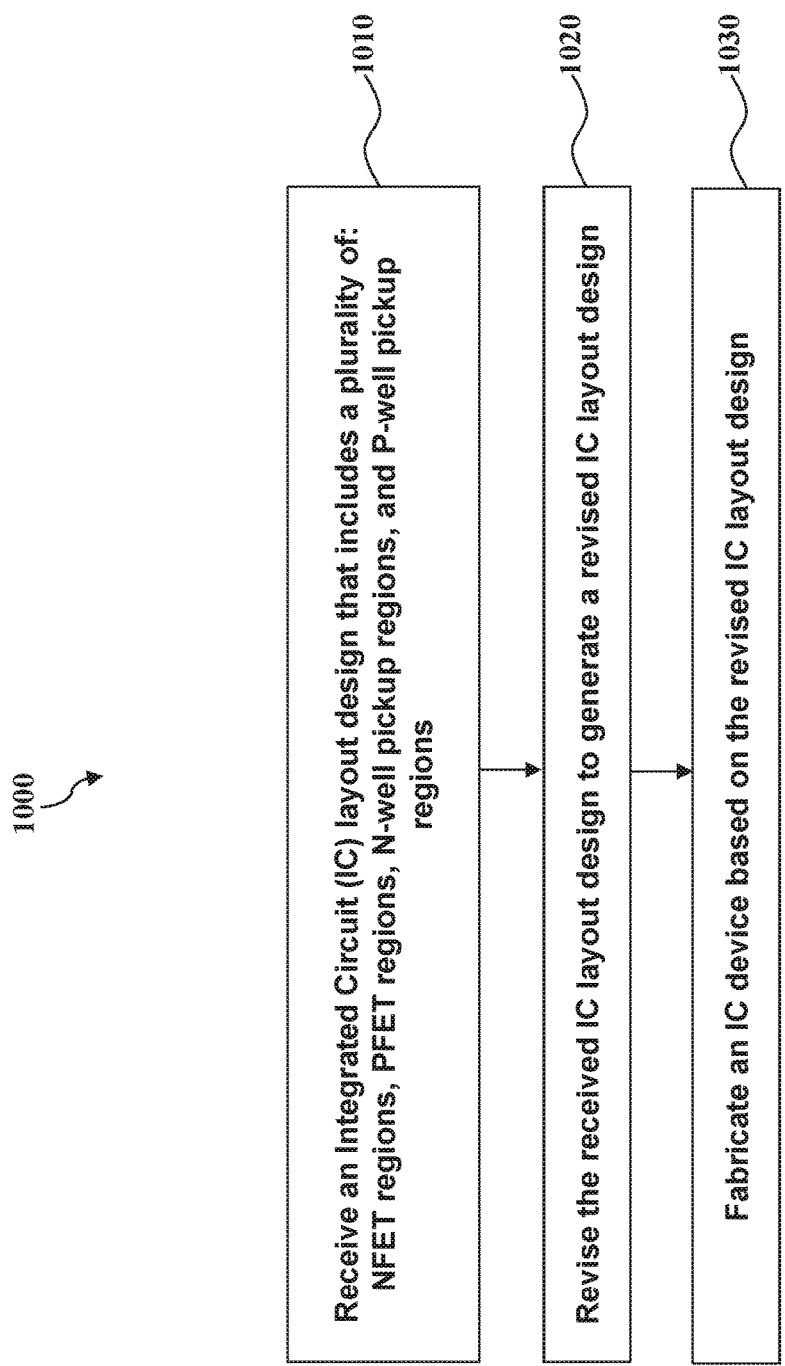
FIG. 9 is a flowchart illustrating a method of fabricating a semiconductor device according to various aspects of the present disclosure.

FIG. 9 is a flowchart illustrating a method 1000 of fabricating a semiconductor device according to embodiments of the present disclosure. The method 1000 includes a step 1010 to receive an Integrated Circuit (IC) layout design that includes a plurality of: PFET regions, NFET regions, N-well pickup regions, and P-well pickup regions. According to the received IC layout design, the PFET regions and the NFET regions each extend in a first direction, the PFET regions interleave with the NFET regions in a second direction different from the first direction, the N-well pickup regions are aligned with the PFET regions, respectively, the P-well pickup regions are aligned with the NFET regions, respectively, and the N-well pickup regions interleave with the P-well pickup regions in the second direction.

The method 1000 includes a step 1020 to revise the received IC layout design at least in part by: replacing a first subset of the N-well pickup regions and a first subset of the P-well pickup regions with a continuous P-well pickup region; and replacing a second subset of the N-well pickup regions and a second subset of the P-well pickup regions with a continuous N-well pickup region.

The method 1000 includes a step 1030 to fabricate an IC device based on the revised IC layout design. In some embodiments, the step 1030 includes implementing a plurality of dummy transistors in the continuous N-well pickup region and in the continuous P-well pickup region. In some embodiments, the step 1030 includes electrically biasing the continuous N-well pickup region or the continuous P-well pickup region to a voltage supply or electrical ground at least in part using the dummy transistors. In some embodiments, the step 1030 includes fabricating a multi-channel gate-all-around (GAA) device.

It is understood that the method 1000 may include further steps performed before, during, or after the steps 1010-1030. For reasons of simplicity, these additional steps are not discussed herein in detail.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure. It is also understood that the various aspects of the present disclosure discussed above may apply to multi-channel devices such as Gate-All-Around (GAA) devices. To the extent that the present disclosure refers to a fin structure or FinFET devices, such discussions may apply equally to the GAA devices.

In summary, the present disclosure configures (or reconfigures) the layout of the N-well pickup regions and the P-well pickup regions of an IC device, such that they do not interleave with one another. Rather, the N-well pickup region and the P-well pickup region of the IC device of the present disclosure extend continuously without interleaving with one another. The N-well pickup region and the P-well pickup region of the IC device of the present disclosure are also much greater in size than their counterparts in conventional IC devices. In some embodiments, the IC device of the present disclosure is fabricated in a 7-nanometer technology node or a smaller technology node.

The present disclosure may offer advantages over conventional devices. However, it is understood that not all advantages are discussed herein, different embodiments may offer different advantages, and that no particular advantage is required for any embodiment. One advantage is that the undesirable inter-well implant dose compensation is reduced. For example, the fact that the N-well and P-well pickup regions do not interleave with one another eliminates the N/P boundaries that would have existed between them (if they had been interleaved). The elimination of these N/P boundaries means that dopants will not diffuse into an oppositely doped well, which would have degraded resistance. Another advantage is that the undesirable aperture effect is also alleviated. For example, since the N-well and P-well pickup regions are now much larger, the aspect ratio of the photoresist layer (used to define the N-well and P-well of the well pickup regions) openings are smaller than conventional devices, and the openings themselves are also much wider/larger. As a result, the implanted dopants are much less likely to bombard into the photoresist walls. This allows the correct dosage of dopants to be implanted into the substrate to form the doped wells properly. For these reasons, the IC device of the present disclosure may have improved performance and/or reliability, for example reduced likelihood of latch-up or burnout. The aspects of the present disclosure are particularly beneficial for newer technology nodes such as the 7-nanometer technology node or below, since the small geometry sizes for these technology nodes mean that the inter-well implant dose compensation and/or implant aperture effect problems would have been more prominent, had they not been resolved by the implementation of the embodiments of the present disclosure. Other advantages may include compatibility with existing fabrication processes (including for both FinFET and GAA processes) and the ease and low cost of implementation.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

One aspect of the present disclosure involves a semiconductor device. The semiconductor device includes a first region that includes a first portion of an N-well and a plurality of P-type transistors formed over the first portion of the N-well. The first region extends in a first direction. The semiconductor device includes a second region that includes a first portion of a P-well and a plurality of N-type transistors formed over the first portion of the P-well. The second region extends in the first direction and shares a first border with the first region, and wherein the first border extends in the first direction. The semiconductor device includes a third region that includes a second portion of the P-well. The third region shares a second border with both the first region and the second region. The second border extends in a second direction that is different from the first direction. The semiconductor device includes a fourth region that includes a second portion of the N-well. The fourth region shares a third border with both the first region and the second region. The third border extends in the second direction, and wherein the first region and the second region are disposed between the third region and the fourth region.

Another aspect of the present disclosure involves a semiconductor device. The semiconductor device includes a plurality of first regions that each extend in a first direction. The first regions include P-type transistors. The semiconductor device includes a plurality of second regions that each extend in the first direction. The second regions include N-type transistors, and wherein the first regions and the second regions interleave with one another in a second direction perpendicular to the first direction. The semiconductor device includes a continuous P-well pickup region disposed to a first side of the first regions and the second regions. The semiconductor device includes a continuous N-well pickup region disposed to a second side of the first regions and the second regions.

Yet another aspect of the present disclosure involves a method of fabricating a semiconductor device. The method includes receiving an Integrated Circuit (IC) layout design that includes a plurality of: NFET regions, PFET regions, N-well pickup regions, and P-well pickup regions. According to the received IC layout design: the NFET regions and the PFET regions each extend in a first direction, the NFET regions interleave with the PFET regions in a second direction different from the first direction, the N-well pickup regions are aligned with the PFET regions, respectively, the P-well pickup regions are aligned with the NFET regions, respectively, and the N-well pickup regions interleave with the P-well pickup regions in the second direction. The method includes revising the received IC layout design to generate a revised IC layout design at least in part by: replacing a first subset of the N-well pickup regions and a first subset of the P-well pickup regions with a continuous P-well pickup region; and replacing a second subset of the N-well pickup regions and a second subset of the P-well pickup regions with a continuous N-well pickup region.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A method, comprising:
    accessing an original Integrated Circuit (IC) layout design, the IC layout design including a plurality of n-type field effect transistor (NFET) regions, a plurality of p-type field effect transistor (PFET) regions, a plurality of N-well pickup regions, and a plurality of P-well pickup regions; and
    generating, based on the original IC layout design, a new IC layout design, wherein the new IC layout design is generated at least in part by substituting a first subset of the N-well pickup regions and a first subset of the P-well pickup regions with a continuous N-well pickup region, and by substituting a second subset of the N-well pickup regions and a second subset of the P-well pickup regions with a continuous P-well pickup region.

2. The method of claim 1, wherein according to the original IC layout design:
    the N-well pickup regions and the P-well pickup regions each extend in a first direction;
    the N-well pickup regions and the P-well pickup regions interleave with one another in a second direction different from the first direction;
    the NFET regions and the PFET regions each extend in the first direction; and
    the NFET regions and the PFET regions interleave with one another in the second direction.

3. The method of claim 2, wherein according to the original IC layout design:
    the NFET regions interleave with the P-well pickup regions in the first direction; and
    the PFET regions interleave with the N-well pickup regions in the first direction.

4. The method of claim 3, wherein according to the new IC layout design:
    each PFET region is disposed between the continuous N-well pickup region and the P-well pickup region.

5. The method of claim 2, wherein according to the original IC layout design:
    the NFET regions and the PFET regions are each longer in the first direction than each of the N-well pickup regions and the P-well pickup regions.

6. The method of claim 2, wherein according to the new IC layout design, the continuous N-well pickup region and continuous P-well pickup region each extend in the second direction.

7. The method of claim 1, wherein the new IC layout design is generated without modifying the NFET regions and the PFET regions.

8. The method of claim 1, further comprising: fabricating an IC device based on the new IC layout design.

9. The method of claim 8, wherein the fabricating the IC device incudes fabricating a FinFET device or fabricating a multi-channel gate-all-around (GAA) device based on the new IC layout design.

10. The method of claim 8, wherein the fabricating the IC device includes:
    fabricating a plurality of dummy transistors in the continuous N-well pickup region and in the continuous P-well pickup region, wherein the dummy transistors are used at least in part to electrically bias the continuous N-well pickup region or the continuous P-well pickup region to a voltage supply or to ab electrical ground.

11. A method, comprising:
    forming, over a substrate, a P-well in a P-well pickup region, a first portion of an N-well in a first p-type field effect transistor (PFET) region, a second portion of the N-well in an N-well pickup region, and a third portion of the N-well in a second PFET region;
    forming a first dummy transistor in the P-well pickup region and forming a second dummy transistor in the N-well pickup region; and
    forming a first functional transistor in the first PFET region and forming a second functional transistor in the second PFET region;
    wherein in a cross-sectional side view, the first portion of the N-well is formed to be located between the P-well and the second portion of the N-well, and the second portion of the N-well is formed to be located between the first portion of the N-well and the third portion of the N-well.

12. The method of claim 11, wherein the forming the first dummy transistor or the forming the second dummy transistor comprises forming conductive contacts as a part of the first dummy transistor or the second dummy transistor.

13. The method of claim 11, further comprising: electrically biasing, at least in part via the first dummy transistor, the P-well to electrical ground.

14. The method of claim 11, further comprising: electrically biasing, at least in part via the second dummy transistor, the N-well to a power supply or a voltage rail.

15. The method of claim 11, wherein in a top view:
    the P-well is formed adjacent to the N-well in a first direction;
    the N-well is formed to be longer than the P-well in the first direction; and
    the P-well is formed to be longer than the N-well in a second direction different from the first direction.

16. The method of claim 15, wherein the P-well is formed to be at least 10 times longer than the N-well in the second direction.

17. A method, comprising:
    receiving an Integrated Circuit (IC) layout design that includes a plurality of: NFET regions, PFET regions, N-well pickup regions, and P-well pickup regions, wherein according to the received IC layout design: the NFET regions and the PFET regions each extend in a first direction, the NFET regions interleave with the PFET regions in a second direction different from the first direction, the N-well pickup regions are aligned with the PFET regions, respectively, the P-well pickup regions are aligned with the NFET regions, respectively, and the N-well pickup regions interleave with the P-well pickup regions in the second direction; and revising the received IC layout design to generate a revised IC layout design at least in part by:

replacing a first subset of the N-well pickup regions and a first subset of the P-well pickup regions with a continuous P-well pickup region; and replacing a second subset of the N-well pickup regions and a second subset of the P-well pickup regions with a continuous N-well pickup region.

18. The method of claim 17, further comprising: fabricating an IC device based on the revised IC layout design.

19. The method of claim 18, wherein the fabricating the IC device includes:

implementing a plurality of dummy transistors in the continuous N-well pickup region and in the continuous P-well pickup region; and electrically biasing the continuous N-well pickup region or the continuous P-well pickup region to a voltage supply or electrical ground at least in part using the dummy transistors.

20. The method of claim 18, wherein the fabricating the IC device incudes fabricating a multi-channel gate-all-around (GAA) device.

* * * * *